CONTROLLABLE SEMICONDUCTOR DEVICES

Filed June 17, 1960

INVENTORS
NICHOLAS DEWOLF
RODERIC E. HALL
BY
Ezekiel Wolf, Wolf & Greenfield
ATTORNEYS United States Patent Office 3,197,652
Patented July 27, 1965

3,197,652

CONTROLLABLE SEMICONDUCTOR DEVICES

Nicholas De Wolf, Boston, and Roderic E. Hall, Waban, Mass., assignors to Transitron Electronic Corporation, Wakefield, Mass., a corporation of Delaware Filed June 17, 1960, Ser. No. 36,773
4 Claims. (Cl. 307—88.5)

The present invention relates in general to semiconductor devices and more particularly concerns a novel semiconductor device having controllable negative resistance characteristics so that it may be utilized as a bistable device.

Semiconductor devices having a negative resistance characteristic such as the Esaki tunnel diode, are known in the semiconductor art. However, this diode has a number of disadvantages. It is a two terminal device so that controlling its state with an external low level control signal is difficult. In addition, maintaining negative resistance within prescribed tolerance limits in production presents serious problems.

Another exemplary prior art device is the four-layer diode comprising four layers of semiconductor material, adjacent layers being of opposite conductivity to define three rectifying junctions. Substantially the full load current is transmitted across all three junctions. Conduction may be initiated by delivering a small control signal current to one of the intermediate layers. Application of this small control current initiates the flow of a much larger load current. However, nearly the entire load current must be withdrawn from the intermediate layer to cut the device off. Thus, most of these devices have turn on gain without turn off gain. And the characteristics of many of these devices are extremely temperature sensitive.

Accordingly, it is an important object of the present invention to provide a semiconductor device having a negative resistance characteristic controllable by a low level signal.

It is another object of the present invention to provide a semiconductor device in accordance with the preceding object having first and second stable states.

It is still a further object of the invention to provide a semiconductor device in accordance with the preceding objects in which either of the stable states may be selected by the low level control signal.

It is still another object of the invention to provide a semiconductor device having a negative resistance characteritsic in which the peak current of said device occurs for a relatively low voltage.

A still further object of the invention is to provide a device in accordance with the preceding objects in which the current for voltages greater than that where the negative resistance characteristic occurs may be independently controlled.

According to the invention, a device with first, second and third terminals includes means for establishing a negative resistance characteristic between said first and third terminals, said negative resistance characteristic being controllable by a signal applied between said first and second terminals.

In a particular form which the invention takes, a semiconductor device is formed with first and second oppositely poled rectifying junctions separated by a thin region of semiconducting material. Means including said terminals are provided for establishing first and second electric fields across said first and second junctions respectively. The first and second fields forward bias and reverse bias the first and second junctions, respectively. The thin region provides a carrier path between the second electrode and the first junction to establish a varying current density along said carrier path so that the current across the second junction varies inversely to the strength of the second field for a prescribed range of magnitude of the latter field strength.

Using conventional transistor definitions, the first and third electrodes are the emitter and collector, respectively. The second is designated as the injector electrode. The thin region is the base region and the desired carrier path having a varying current density may be established by pinching off a portion of the base region between the injector and base-emitter junction. This may be accomplished by etching a portion of the base region or by diffusing an impurity of conductivity opposite to that of the base region into a portion of the base region between the injector and emitter electrodes.

According to another feature of the invention, a separate base is provided for controlling the collector current magnitude.

Numerous other features, objects and advantages of the invention will become apparent from the following specification when read in connection with the accompanying drawing in which.

Figure 4:
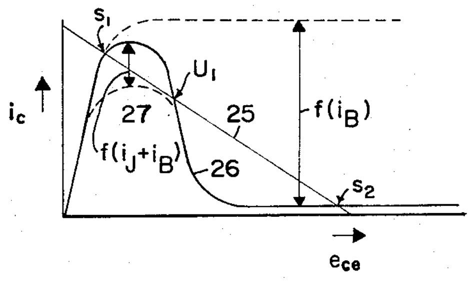
Figure 5:
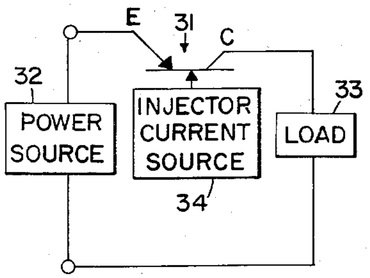

FIG. 4 graphically represents the device characteristics with respect to a typical load line; and FIG. 5 is a combined block-schematic circuit diagram of a system according to the invention in which the novel device is used for overload protection.

Figure 1:
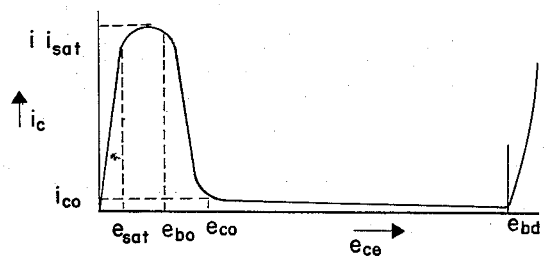
FIG. 1 is a graphical representation of the collector current, $i_c$, as a function of the collector-emitter voltage, $e_{ce}$, to illustrate the novel characteristics of the invention.

With reference now to the drawing and more particularly FIG. 1 thereof, there is illustrated a graphical representation of the collector current as a function of the collector-emitter voltage. In explaining the mode of operation of the invention, it is helpful to define certain parameter values of the characteristic in FIG. 1. It will be observed that for small values of $e_{ce}$, the collector current, $i_c$, rises very rapidly until the saturation value, $i_{sat.}$, of the collector current is reached. It is convenient to define the voltage where the slope decreases sharply as the saturation voltage, $e_{sat.}$.

The next higher voltage of interest is the voltage where the slope sharply increases in the negative direction which is designated the break off voltage, $e_{bo}$. The next higher voltage of interest is the cut-off voltage $e_{co}$ where the collector current reaches its cut-off value, $i_{co}$. Finally, there is the breakdown voltage, $e_{bd}$, where avalanching or Zener breakdown occurs and the current rises very sharply with a slight increase in voltage.

Before explaining the significance of the different parameters, it is helpful to consider the physical structure of a semiconductor device according to the invention. External circuit connections are made through an emitter terminal E, injector terminal J and a collector terminal C. The latter terminals are connected to metal layers 11, 12 and 13 respectively in contact with the emitter layer 14, injector layer 15 and collector layer 16. The emitter layer 14 and collector layer 16 of like conductivity type are separated by the injector layer 15 of opposite conductivity.

Oppositely poled rectifying junctions 17 and 18 are formed between the injector layer 15 and the emitter layer 14 and between the injector layer 15 and collector layer 16.

A portion 21 of the injector layer 15 has been etched away so that its cross-sectional area is less than adjacent portions of the injector layer. This portion defines a carrier path between the emitter electrode E and the injector electrode J with the current density in the path increasing in the portion 21. However, a device with a thin injector layer of any cross section may be satisfactory.

Figure 2:
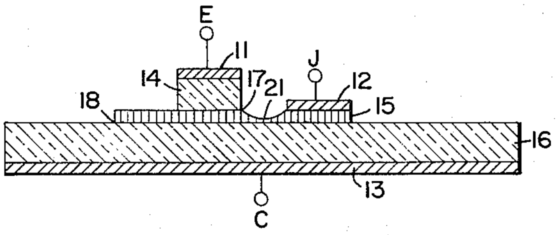
FIG. 2 is a sectional view through a semiconductor device according to the invention having the characteristic of FIG. 1.

Having described the physical structure of the semiconductor device according to the invention, it is appropriate to consider the relationship between the characteristic of FIG. 1 and the physical events believed to be occurring in the structure of FIG. 2 for different voltage ranges of the characteristic.

For low values of $e_{cc}$, the device behaves as a conventional transistor in which the current carrying capacity of the pinched portion 21 has not been exceeded and collector current is proportional to collector-emitter voltage. When the saturation voltage $e_{sat.}$ is reached, the current carrying capacity of the constricted portion 21 becomes nearly a maximum and the saturation current, $i_{sat.}$ is reached at a slightly higher potential.

In conventional transistors, more current carriers cross the junction between the base and collector regions after injection of like carriers into the base region through the base electrode, a stream of such carriers flowing between base and emitter. The collector current is proportional to emitter-collector potential until current saturation is reached.

In the semiconductor device according to the invention, as the collector-emitter voltage is increased beyond the break-off voltage, $e_{bo}$, the constricted portion 21 becomes blocked with carriers to effectively pinch shut the channel of injected carriers flowing to the collector. As the collector voltage is increased, collector current then decreases until the cut-off voltage $e_{co}$, is reached. The constricted region 21 is then fully blocked and only the cut-off current, $i_{co}$, flows in the collector region 16 to the collector terminal C.

It is believed that increasing the collector potential increases the width of the charge layer in the injector region adjacent to the rectifying junction. When this charge layer occupies the full width of the injector region, the flow of injector current ceases. Consequently, blocking injector current cuts off that portion of collector current initiated by the flow of injector current.

The current remains essentially constant at cut-off value until the voltage $e_{cc}$ equals the breakdown potential, $e_{bd}$. The collector current then increases sharply due to avalanching or Zener breakdown.

The value of the saturation current, $i_{sat.}$, may be controlled by the injector current delivered to terminal J. If the injector current is increased, the saturation peak is increased. Increasing the injector current does not appreciably affect the cut-off voltage.

Figure 3:
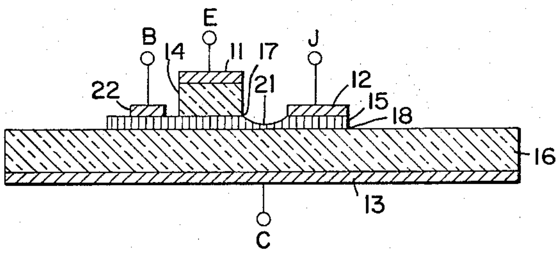
FIG. 3 is still another semiconductor device according to the invention having a connection to the base region to permit independent control of the collector current.

Referring to FIG. 3, there is shown a sectional view through another semiconductor device according to the invention with a base connection added to the left side of injector layer 15. The reference symbols of FIG. 2 identify corresponding portions of FIG. 3. The function of this base electrode is to provide independent control of the collector current at any voltage, thus permitting the device to be turned on by applying a low level control current to this lead. The use of the base connection is important because it enables the device to be independently switched from one stable state to the other with the device imparting gain when switching from either state. Thus, the device of FIG. 3 can function as a static storage element, suitable for replacing a flip-flop.

This will be better understood by referring to FIG. 4 which shows the characteristic of FIG. 1 in solid lines together with variations which may be effected in said characteristics by adjusting the base and injector currents. A resistive load line 25 for a load resistor in series with the collector and the emitter-collector supply voltage is also shown.

The load line 25 intersects the solid curve 26 at points $S_1$ and $S_2$ corresponding to two stable operating points and an intermediate unstable operating point. The intersection with curve 26 at the point $U_1$ is unstable since the resistance at this point is negative. The peak current for emitter voltage below $e_{co}$ is variable and a function of the sum of injector and base currents, $(i_j+i_b)$. The collector current beyond $e_{co}$ is a function of the base current $i_b$ and variable over wide limits.

Consider a situation where the device is initially operating at the stable operating point $S_1$. If the injector current is now reduced so that the peak current drops below the load line 25 to the broken line position 27, the semiconductor device immediately switches over to assume the stable operating conditions at $S_2$. The base current may then be returned to its normal value establishing the peak current represented by the peak value of curve 26, but the operating point will remain at $S_2$.

If it is now desired to switch back to the initial stable state, it is only necessary to raise the base current, so that $i_c$ rises to a point above the load line and the device immediately switches over to the operating point corresponding to the point $S_1$, thereby returning to the initial stable state.

An important feature of the invention resides in its ability to respond to low level switching signals because the device itself provides switching gain to rapidly effect the changeover in stable state.

Still another feature of the invention is in the provision of separate terminals for establishing the set and the reset condition. And a single semiconductor device performs the function of prior art circuits requiring a number of solid state devices.

The uses of a device of this type wherever a bistable element is required, are evident. Digital computers require many such devices in memories and for use in logical circuitry.

Referring to FIG. 5, the use of the device is illustrated as an overload protective device. The device 31 is connected in series with a source 32 and a load 33 so that the collector current flows through the load. An injector current source 34 establishes an injector current consistent with the maximum allowable saturation current and consequently, the maximum load current which load 33 can draw. Under normal operating conditions, the device 31 operates at point $S_1$ of FIG. 4. Since the voltage across the device 31 is very low at this point, the power dissipated in device 31 is very small. Now if load 33 suddenly develops an overload, the current therethrough suddenly increases to raise the voltage across the collector and emitter and move the operating point to the negative resistance region. Being unstable in this condition, the device rapidly switches over to an operating point $S_2$ and the current to the load 33 immediately drops, causing the current drawn by the load 33 to correspond to the cutoff value, $i_{co}$, and rapidly terminate the overload condition. Resetting may be effected by placing a switch in series with the collector or emitter leads so that the collector current is returned to zero and then closing the switch. Alternatively, the device of FIG. 3 may be used and reset by increasing the base current.

There has been described a novel device exhibiting characteristics permitting flexible control of a logical element which is compact, relatively easy to fabricate and having numerous uses in logical circuits and other applications. The specific uses, structures and methods of manufacture described herein are by way of example only. It is evident that those skilled in the art may now make numerous modifications of and departures from the specific embodiments, uses and techniques described herein without departing from the inventive concepts. Consequently, the invention is to be construed as limited only by the spirit and scope of the appended claims.

What is claimed is:

1. A semiconductor device comprising,
first, second and third terminals,
first, second and third contiguous semiconductor regions,
adjacent regions being of opposite conductivity to define a first rectifying junction portion between said first and second regions and a second rectifying junction portion between said second and third regions with said first and second rectifying junction portions polarized in opposite sense,
said first and second rectifying junction portions being in series between said first and second terminals,
a fourth semiconductor region of the same type conductivity as said second region adjacent to said third region and said third terminal and defining with said third region a third rectifying junction portion in series with said first and second rectifying junction portions between said first and third terminals with said first and third rectifying junction portions polarized in the same sense,
means including said fourth region and means intercoupling said second and fourth regions establishing a carrier conduction path from said third terminal for exercising control over the second terminal current and for establishing a negative resistance characteristic between said first and second terminals in which an increase in potential therebetween is accompanied by a decrease in current flowing through said second terminal for a prescribed potential range above a breakover potential and for establishing a positive resistance characteristic between said first and second terminals in which an increase in potential therebetween is accompanied by an increase in current flowing through said second terminal below a saturation current potential lower than said breakover potential which saturation current potential corresponds to the lowest potential where maximum second terminal current is attained when the only potential changed is that between said first and second terminals,
the current through said second terminal then being a single valued function of the potential between said first and second terminals,
the magnitude of said saturation current being controllable and a function of the current flowing through said third terminal.

2. A semiconductor device in accordance with claim 1 and further comprising,
a fourth terminal arranged with said second rectifying junction portion between said second and fourth terminals and comprising means for establishing the magnitude of said saturation current also a function of the current flowing through said fourth terminal into the semiconductor region adjacent to said second rectifying junction.

3. A semiconductor device in accordance with claim 1 and further comprising,
a power source,
a load in series with said power source forming a series combination coupled between said first and second terminals,
a control current source coupled to said third terminal and providing a control current through said third terminal establishing a normal current flowing through said load and said second terminal from said power source to establish a potential between said first and second terminals smaller than said breakover potential whereby an increase in the current drawn by said load which increases the potential between said first and second terminals above said breakover potential produces a reduction in the current to provide overload protection.

4. A semiconductor device in accordance with claim 1 wherein said means intercoupling said second and fourth regions comprises a semiconductor region of the same conductivity type as said second and fourth regions and formed with a constriction that separates said second rectifying junction portion from said third rectifying junction portion.

References Cited by the Examiner

UNITED STATES PATENTS

| | | | |
|---|---|---|---|
| 2,655,610 | 10/53 | Ebers | 307—88.5 |
| 2,754,431 | 7/56 | Johnson | 307—88.5 |
| 2,778,956 | 1/57 | Dacey et al. | 307—88.5 |
| 2,801,348 | 7/57 | Pankove | 307—88.5 |
| 2,877,359 | 3/59 | Ross | 307—88.5 |
| 2,921,205 | 1/60 | Giacoletto | 307—88.5 |
| 2,993,154 | 7/61 | Goldey et al. | 317—235 |
| 3,098,160 | 7/63 | Noyce | 307—88.5 |
| 3,100,276 | 8/63 | Meyer | 307—88.5 X |
| 3,111,590 | 11/63 | Noyce | 307—88.5 |
| 3,118,114 | 1/64 | Barditch | 317—235 X |
| 3,141,119 | 7/64 | Philips | 317—235 |

JOHN W. HUCKERT, *Primary Examiner.*

HERMAN KARL SAALBACH, *Examiner.*